United States Patent
Koyama et al.

(10) Patent No.: US 9,365,165 B2
(45) Date of Patent: Jun. 14, 2016

(54) ONBOARD EQUIPMENT FIXING STRUCTURE

(71) Applicant: MITSUBISHI JIDOSHA KOGYO KABUSHIKI KAISHA, Tokyo (JP)

(72) Inventors: Kenta Koyama, Okazaki (JP); Hirotaka Shuto, Okazaki (JP); Makoto Kamachi, Okazaki (JP); Tatsuya Yasukochi, Kariya (JP)

(73) Assignee: MITSUBISHI JIDOSHA KOGYO KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 13/938,894

(22) Filed: Jul. 10, 2013

(65) Prior Publication Data

US 2014/0014794 A1 Jan. 16, 2014

(30) Foreign Application Priority Data

Jul. 11, 2012 (JP) .................................. 2012-155621

(51) Int. Cl.
*A47B 96/06* (2006.01)
*B60R 11/00* (2006.01)
*H05K 5/00* (2006.01)

(52) U.S. Cl.
CPC .............. *B60R 11/00* (2013.01); *H05K 5/0073* (2013.01)

(58) Field of Classification Search
USPC .............. 248/200, 213.3, 201, 232, 235, 247, 248/250, 205.7, 205.1, 909
See application file for complete search history.

(56) References Cited

U.S. PATENT DOCUMENTS

| | | | | |
|---|---|---|---|---|
| 4,557,445 A | * | 12/1985 | Ohara | 248/27.1 |
| 5,012,998 A | * | 5/1991 | Gautier et al. | 248/222.14 |
| 5,511,750 A | * | 4/1996 | Evenson | 248/200 |
| 5,577,695 A | * | 11/1996 | Ruckwardt | 248/200 |
| 6,398,259 B1 | * | 6/2002 | Palmer et al. | 280/777 |
| 6,547,478 B1 | * | 4/2003 | Lin | 403/339 |
| 6,742,572 B2 | * | 6/2004 | Muhammad et al. | 165/67 |

(Continued)

FOREIGN PATENT DOCUMENTS

| | | |
|---|---|---|
| JP | 2003-276644 A | 10/2003 |
| JP | 2008-254681 A | 10/2008 |

(Continued)

OTHER PUBLICATIONS

Japanese Office Action, dated Mar. 29, 2016, issued in corresponding Japanese Patent Application No. 2012-155621 (with English translation).

*Primary Examiner* — Monica Millner

(74) *Attorney, Agent, or Firm* — Birch, Stewart, Kolasch & Birch, LLP

(57) ABSTRACT

An onboard equipment fixing structure for an onboard equipment which is mounted in a vehicle includes a bracket which fixes the onboard equipment to a vehicle body part of the vehicle. The bracket includes a vehicle body attaching portion which is attached to the vehicle body part, an equipment attaching portion which is attached to a side surface of the onboard equipment which extends in a vertical direction of a vehicle body, a connecting portion which connects the vehicle body attaching portion and the equipment attaching portion, and an opening portion which is formed in an area surrounded by the vehicle body attaching portion, the equipment attaching portion and the connecting portion. The vehicle body attaching portion is fixed to the vehicle body part so as to be disposed closer to the outside of the vehicle body than the equipment attaching portion.

5 Claims, 5 Drawing Sheets

(56) References Cited

U.S. PATENT DOCUMENTS

| | | | | |
|---|---|---|---|---|
| 7,175,142 | B2* | 2/2007 | Brown | 248/213.3 |
| 7,677,583 | B2* | 3/2010 | Armstrong et al. | 280/163 |
| 7,735,785 | B2* | 6/2010 | Wippler et al. | 248/27.1 |
| 7,856,916 | B2* | 12/2010 | Anderson | 89/44.02 |
| 7,997,548 | B2* | 8/2011 | Sugiyama et al. | 248/220.21 |
| 2004/0173716 | A1* | 9/2004 | Gegalski et al. | 248/200 |
| 2005/0006052 | A1* | 1/2005 | Kozdras et al. | 165/67 |
| 2006/0169855 | A1* | 8/2006 | Chen | 248/200 |
| 2006/0243870 | A1* | 11/2006 | Ishiguro et al. | 248/200 |
| 2009/0072521 | A1* | 3/2009 | Jang et al. | 280/728.2 |
| 2009/0152416 | A1* | 6/2009 | Kim | 248/205.1 |
| 2011/0233353 | A1* | 9/2011 | Palmer | 248/201 |
| 2012/0193490 | A1* | 8/2012 | Muckelrath et al. | 248/205.1 |
| 2012/0193493 | A1* | 8/2012 | Rekasch | 248/226.11 |

FOREIGN PATENT DOCUMENTS

| | | |
|---|---|---|
| JP | 2009-083591 A | 4/2009 |
| JP | 2012-96746 A | 5/2012 |

* cited by examiner

ONBOARD EQUIPMENT FIXING STRUCTURE

BACKGROUND

The present invention relates to a fixing structure for various types of electronic equipment mounted in a vehicle.

Various types of electronic equipment are mounted in vehicles. In a vehicle employing as a drive source a driving electric motor which rotates by receiving electric power from a high-voltage battery, electronic equipment such as an inverter unit and a control box for controlling the inverter unit is mounted as onboard equipment. In general, onboard equipment is attached to the other end of a bracket which is fixed to a vehicle body at one end thereof to be fixed to a vehicle body part. In such a vehicle including the electric motor, in case the inverter unit or the control box is damaged when the vehicle is involved in a collision, the driving of the vehicle is badly affected. Alternatively, their internal structures are exposed to be a danger to the safety of the vehicle. To prevent the occurrence of these unfavorable incidents, safety measures are taken. For example, Patent Literature 1 describes a structure in which onboard equipment is fixed to a pair of cross bars which are provided to connect left and right side members together for the purpose of increasing a safety performance in relation to a collision of the vehicle. In this structure, the onboard equipment is fixed to a cross bar on a passenger compartment side of a vehicle body via a bracket so that a space is defined between the onboard equipment and the passenger compartment side of the vehicle body. Then, in this configuration, when the vehicle is involved in a collision, the onboard equipment is allowed to move into the space.

[Patent Literature 1] JP-A-2012-96746

SUMMARY

Onboard equipment is subjected to a vertical load when a vehicle is running, and therefore, it is necessary to take countermeasures against vibrations in mounting the onboard equipment in the vehicle. Although Patent Literature 1 describes the increase in the safety performance of the vehicle when it is involved in a collision, no description is made on the vibration countermeasures, and hence, there is a demand for realization of the mounting strength against the vertical load or the vertical mounting strength and the safety performance required when the vehicle is involved in a collision in a compatible fashion. In addition, when a separate bracket is used only to increase the mounting strength against the vertical load, there is caused a different problem that the number of parts involved is increased or an installation space needs to be secured. An object of the invention is to provide an onboard equipment fixing structure which realizes the vertical mounting strength and the safety at the time of collision of a vehicle in a compatible fashion while suppressing the increase in the number of parts involved and the securement of the installation space.

According to one advantage of the invention, there is provided an onboard equipment fixing structure for an onboard equipment which is mounted in a vehicle, comprising:

a bracket which fixes the onboard equipment to a vehicle body part of the vehicle, wherein the bracket includes:

a vehicle body attaching portion which is attached to the vehicle body part;

an equipment attaching portion which is attached to a side surface of the onboard equipment which extends in a vertical direction of a vehicle body;

a connecting portion which connects the vehicle body attaching portion and the equipment attaching portion; and an opening portion which is formed in an area surrounded by the vehicle body attaching portion, the equipment attaching portion and the connecting portion, and wherein the vehicle body attaching portion is fixed to the vehicle body part so as to be disposed closer to the outside of the vehicle body than the equipment attaching portion.

The connecting portion may include a brittle part which becomes a starting point of a deformation in a direction which intersects an input direction of a collision load.

In the onboard equipment fixing structure, the connecting portion may include a plurality of vertical wall parts, and the opening portion may be surrounded by the vehicle body attaching portion, the equipment attaching portion and the vertical wall parts.

The vertical wall parts may be formed so that their side sectional shape expands gradually from the vehicle body attaching portion towards the equipment attaching portion.

DETAILED DESCRIPTION OF EXEMPLIFIED EMBODIMENTS

Figure 1:
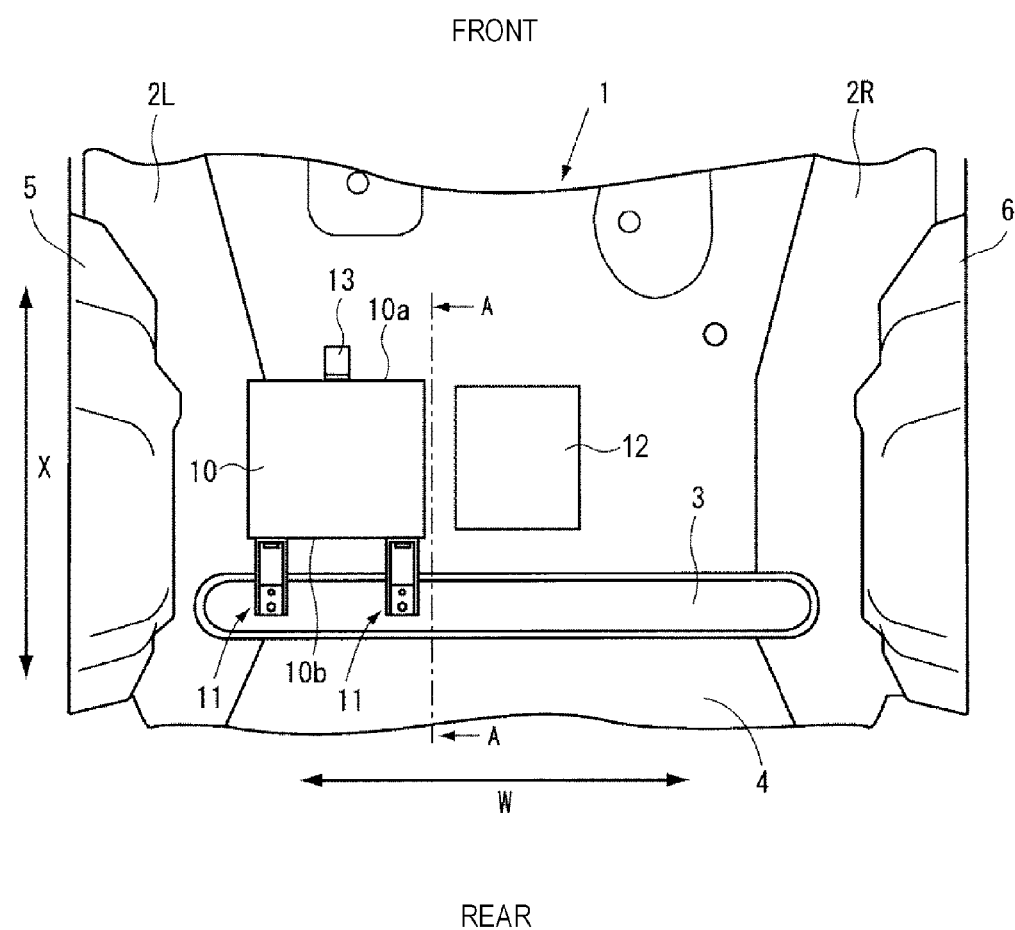
FIG. 1 is a plan view showing an onboard equipment fixing structure according to the invention.
Figure 2:
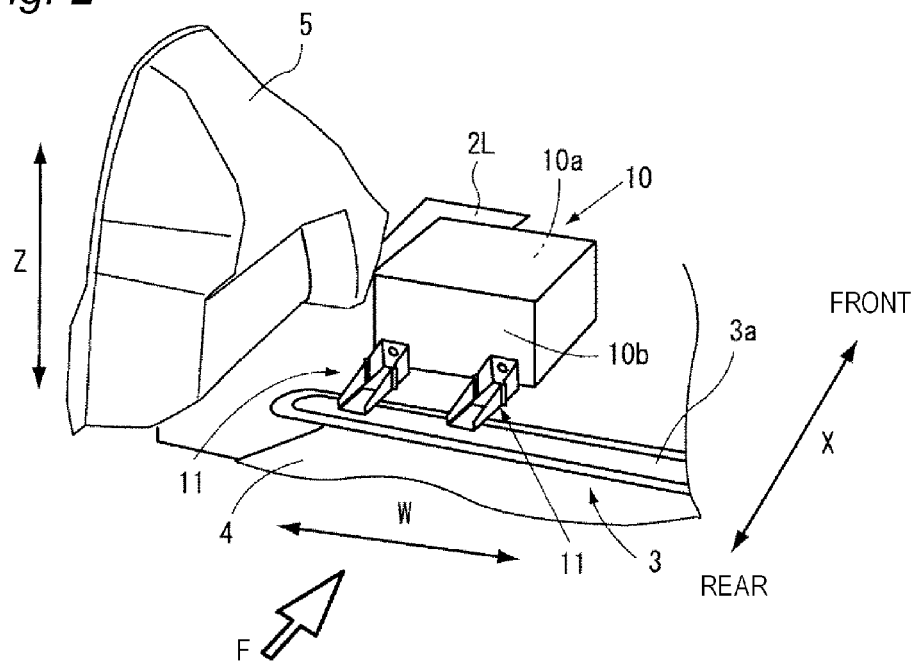
FIG. 2 is a perspective view showing the onboard equipment fixing structure according to the invention.
Figure 3:
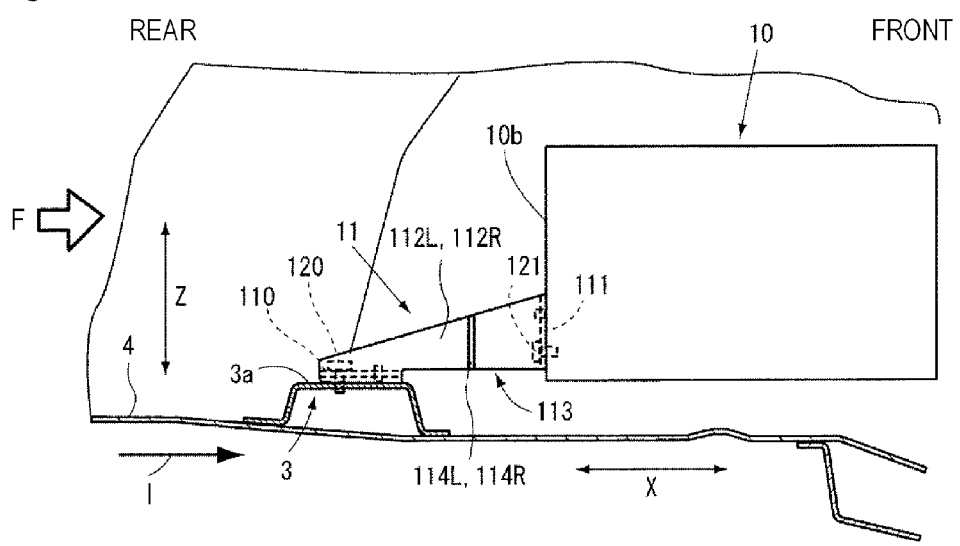
FIG. 3 is a sectional view taken along the line A-A in FIG. 1 which shows the onboard equipment fixing structure according to the invention.

Hereinafter, embodiments of the invention will be described by the use of the drawings. A vehicle 1 shown in FIGS. 1, 2, 3 is an electric vehicle employing as a drive source a driving electric motor which is supplied with electric power from a high-voltage battery unit, not shown, to rotate. The vehicle 1 is not limited to the electric vehicle but may be a hybrid vehicle which includes an internal combustion engine and an electric motor, or an electric vehicle or a hybrid vehicle whose high-voltage battery unit can be recharged from an outside power supply.

The vehicle 1 includes side members 2L, 2R, a cross member 3, and a floor panel 4. The side members 2L, 2R are situated in a vehicle's width direction indicated by an arrow W and extend in a vehicle's longitudinal direction indicated by an arrow X. The cross member 3 is connected to the side member 2L and the side member 2R at both ends thereof. The floor panel 4 is connected to the side members 2L, 2R and the cross member 3. A lower part of a vehicle body is made up of these constituent members. Rear wheel inner panels 5, 6 are connected to both sides of the floor panel 4 which are situated in the vehicle's width direction.

In the vehicle 1, a control unit 10 and an inverter 12 are mounted and disposed side by side in the vehicle's width direction as onboard equipment. The control unit 10 is fixed to the floor panel 4 at a side surface 10a which is situated at a front side thereof by a bracket 13 and is fixed to the cross member 3 at a side surface 10b which is situated at a rear side thereof by brackets 11, 11.

Next, the configuration of the brackets 11, which constitutes a configuration characteristic of the invention, will be described. The brackets 11 have the same configuration, and in this embodiment, two brackets 11, 11 are used to fix the control unit 10 to the cross member 3.

Figure 4:
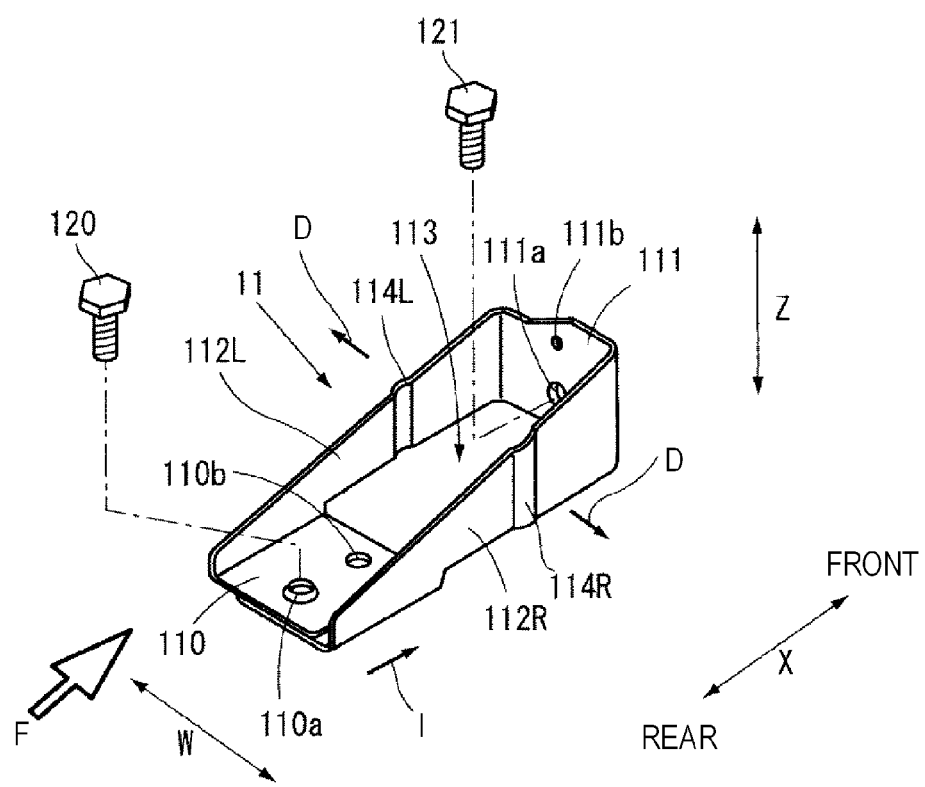
FIG. 4 is a perspective view showing the configuration of a bracket employed in the onboard equipment fixing structure according to the invention.

As shown in FIG. 4, an attaching portion 110 (a vehicle body attaching portion) is formed at one end of the bracket 11 where the bracket 11 is attached to the cross member 3, and an attaching portion 111 (an equipment attaching portion) is formed at the other end of the bracket 11 where the bracket 11 is attached to the side surface 10b of the control unit 10. The bracket 11 includes further vertical wall parts 112L, 112R which are connecting portions which connect the attaching portion 110 and the attaching portion 111 and an opening portion 113 which is formed in an area surrounded by the attaching portion 110, the attaching portion 111, and the vertical wall parts 112L, 112R. The bracket 11 is formed of a single metallic plate by pressing.

The attaching portion 110 is formed into an attaching portion which is parallel to an upper surface 3A of the cross member 3 by bending inwards respective ends of the vertical wall parts 112L, 112R and superposing the inwardly bent portions one on the top of the other. An attaching hole 110a through an attaching bolt 120 is inserted and a positioning hole 110b are formed in the attaching portion 110.

The attaching portion 111 is formed into an attaching portion which is disposed at right angles to the attaching portion 110 and which is parallel to the side surface 10b of the control unit 10 by connecting together the other ends of the vertical wall parts 112L, 112R. An attaching hole 111a through which an attaching bolt 121 is inserted and a positioning hole 111b are formed in the attaching portion 111.

The vertical wall parts 112L, 112R are formed so that their side sectional shape gradually expands as they extend from the attaching portion 110 to the attaching portion 111, whereby when vibrations are applied to the attaching portion 110 and the attaching portion 111 which are at right angles to each other in a vehicle's vertical direction Z, a torsional rigidity in the vehicle's vertical direction is increased more than when the attaching portion 110 and the attaching portion 111 form an L-shaped bracket.

In the vertical wall parts 112L, 112R, bead portions 114L, 114R are formed so as to extend in the vehicle's vertical direction, and these bead portions 114L, 114R function as brittle parts where a deformation starts in the vehicle's width direction W which intersects an input direction I of a collision load F. In this embodiment, the bead portions 114L, 114R are formed so as to protrude transversely outwards so that the bracket 11 is deformed in a direction D in which a distance between connecting portions of the vertical wall parts 112L, 112R which face each other oppositely is increased when the collision load F is applied to the bracket 11. When the bead portions 114L, 114R are caused to be deformed in a direction in which the distance between the connecting portions is decreased, the bead portions 114L, 114R may be formed so as to protrude transversely inwards. However, in this embodiment where the distance between the connecting portions is originally narrow, in case the connecting portions are deformed transversely inwards, it is anticipated that the deformation of the connecting portions in the colliding direction is interrupted when the collision load F is inputted. Because of this, it is desirable that the direction in which the bead portions protrude is determined in consideration of the distance between the connecting portions.

The brackets 11, 11 are disposed side by side in the vehicle's width direction. The respective attaching portions 110 of the brackets 11, 11 are disposed closer to the rear of the vehicle or the outside of the vehicle body than the attaching portions 111 thereof and are then fixed to the cross member 3 with attaching bolts 120. On the other hand, the respective attaching portions 111 of the brackets 11, 11 are each fixed to the side surface 10b of the control box 10.

According to the onboard equipment fixing structure that is configured as has been described heretofore, in each bracket 11, the attaching portion 110 where the bracket 11 is attached to the cross member 3 and the attaching portion 111 where the bracket 11 is attached to the side surface 10b of the control box 10 which extends in the vertical direction Z of the vehicle body are connected together by the connecting portions 112L, 112R. Therefore, the torsional strength against vibrations in the vertical direction Z of the vehicle body is increased without providing a separate part. This can increase the mounting strength of the control box 10 against vibrations in the vertical direction Z of the vehicle body without calling for the increase in the number of parts involved and in the installation space. In addition, the opening portion 113 is formed in the area surrounded by the attaching portion 110, the attaching portion 111 and the connecting portions 112, and the attaching portion 110 is disposed closer to the outside of the vehicle body (the rear of the vehicle body) than the attaching portion 111 so as to be fixed to the cross member 3. Therefore, the opening portion 113 constitutes a brittle part when the collision load F is inputted into the vehicle 1, whereby the bracket 11 becomes easy to be deformed when the collision load F is inputted into the bracket 11. Because of this, the load applied to the side surface 10b of the control box 10 can be mitigated by the brackets 11, 11 which resist the collision load F so inputted, thereby making it possible to prevent the damage to the control box 10 that would otherwise be made by the brackets 11, 11. This enables the realization of the mounting strength of the control box against vibrations in the vertical direction Z of the vehicle body and the safety of the vehicle 1 when it is involved in a collision in a compatible fashion while suppressing the increase in the number of parts involved and the installation space. Further, the bead portions 114L, 114R are formed in the vertical wall parts 112L, 112R so as to constitute the points where the deformation starts in the vehicle's width direction W which is the direction intersecting the input direction I of the collision load F. Therefore, the degree of deformation of the vertical wall parts 112L, 112R when the collision load F is inputted into the bracket 11 can be controlled.

Figure 5:
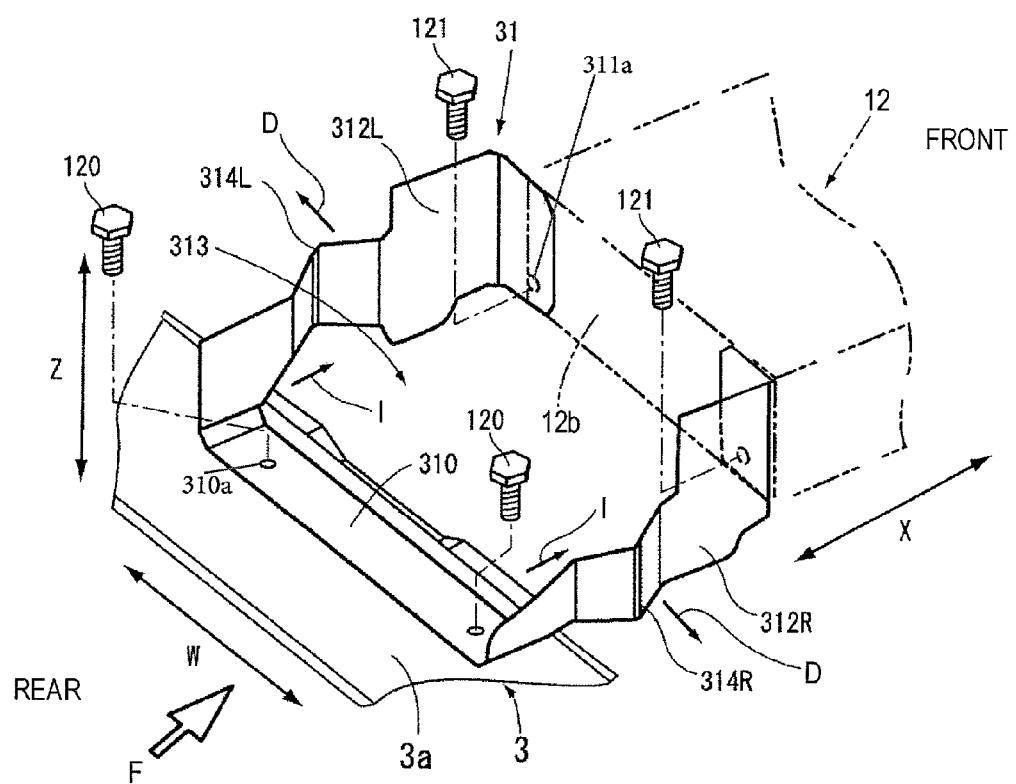
FIG. 5 is a perspective view showing a modified example made to the onboard equipment fixing structure according to the invention.
Figure 6:
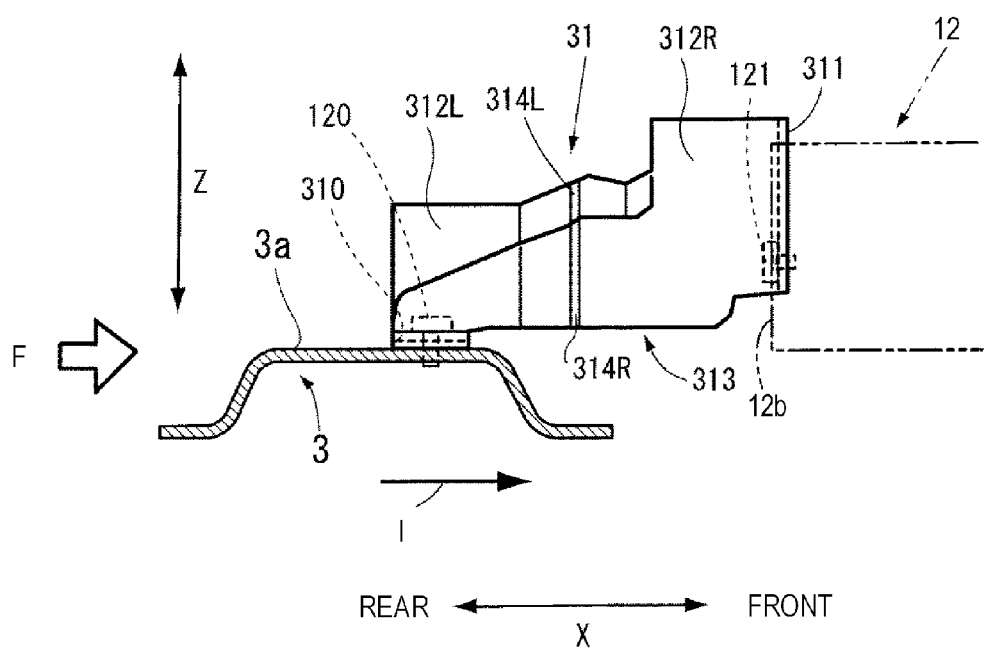
FIG. 6 is a side view showing the modified example made to the onboard equipment fixing structure according to the invention.

FIGS. 5 and 6 show a different type of bracket. A bracket 31 shown in FIGS. 5 and 6 fixes the inverter unit 12, which is onboard equipment, to the cross member 3, which is vehicle body part. As shown in FIG. 5, an attaching portion 310 is formed at one end of the bracket 31 where the bracket 31 is attached to the cross member 3, and an attaching portion 311 is formed at the other end of the bracket 31 where the bracket 31 is attached to a side surface 12b of the inverter unit 12. This bracket 31 includes an opening portion 313 in an area which is surrounded by vertical wall parts 312L, 312R which constitute connecting portions which connect together the attaching portion 310 and the attaching portion 311, the attaching portion 310 and the attaching portion 311. The bracket 31 is formed of a single metallic plate by pressing.

The attaching portion 310 is formed into an attaching portion which is parallel to the upper surface 3A of the cross member 3 by bending respective ends of the vertical wall parts 312L, 312R which face each other oppositely and connecting them together. Attaching holes 310a through which attaching bolts 120 are inserted are formed in the attaching portion 310.

The attaching portion 311 is formed into an attaching portion which intersects the attaching portion 310 and which becomes parallel to the side surface 12b of the inverter unit 12 by bending the other ends of the vertical walls 312L, 312R. Attaching holes 311a through which attaching bolts 121 are inserted are formed in the attaching portion 311.

The vertical wall parts 312L, 312R are formed so that their side sectional shape gradually expands as they extend from the attaching portion 310 to the attaching portion 311, whereby when vibrations are applied to the attaching portion 310 and the attaching portion 311 which are at right angles to each other in the vehicle's vertical direction Z, a torsional rigidity is increased more than when the attaching portion 310 and the attaching portion 311 form an L-shaped bracket.

In the vertical wall parts 312L, 312R, bent portions 314L, 314R are formed, and these bent portions 314L, 314R function as brittle parts where a deformation starts in the vehicle's width direction W which intersects the input direction I of the collision load F. In this embodiment, the bent portions 314L, 314R are formed so as to protrude transversely outwards so that the bracket 31 is deformed in a direction in which a distance between connecting portions of the vertical wall parts 312L, 312R which face each other oppositely is increased when the collision load F is applied to the bracket 31.

The attaching portion 310 of the bracket 31 is disposed closer to the outside of the vehicle body or the rear of the vehicle than the attaching portion 311 so as to be fixed to the cross member with the attaching bolts 120. On the other hand, the attaching portion 311 of the bracket 31 is fixed to the side surface 12b of the inverter unit 12 with the attaching bolts 121.

According to the onboard equipment fixing structure that is configured as has been described heretofore, in each bracket 31, the attaching portion 310 where the bracket 31 is attached to the cross member 3 and the attaching portion 311 where the bracket 31 is attached to the side surface 12b of the inverter unit 12 which extends in the vertical direction Z of the vehicle body are connected together by the connecting portions 312L, 312R. Therefore, the torsional strength against vibrations in the vertical direction Z of the vehicle body is increased. This can increase the mounting strength of the inverter unit 12 against vibrations in the vertical direction Z of the vehicle body without calling for the increase in the number of parts involved and in the installation space. In addition, the opening portion 313 is formed in the area surrounded by the attaching portion 310, the attaching portion 311 and the connecting portions 312L, 312R, and the attaching portion 310 is disposed closer to the outside of the vehicle body (the rear of the vehicle body) than the attaching portion 311 so as to be fixed to the cross member 3. Therefore, the opening portion 313 constitutes a brittle part when the collision load F is inputted into the vehicle 1, whereby the bracket 31 becomes easy to be deformed when the collision load F is inputted into the bracket 31. Because of this, the load applied to the side surface 12b of the inverter unit 12 can be mitigated by the brackets 31 which resist the collision load F so inputted, thereby making it possible to prevent the damage to the inverter unit 12 that would otherwise be made by the brackets 31. This enables the realization of the mounting strength of the inverter unit 12 against vibrations in the vertical direction Z of the vehicle body and the safety of the vehicle 1 when it is involved in a collision in a compatible fashion while suppressing the increase in the number of parts involved and the installation space.

In addition, the bend portions 314L, 314R are formed in the vertical wall parts 312L, 312R so as to constitute the points where the deformation starts in the vehicle's width direction W which is the direction intersecting the input direction I of the collision load F. Therefore, the degree of deformation of the vertical wall parts 312L, 312R when the collision load F is inputted into the bracket 31 can be controlled.

The portion where the attaching portions 110, 310 are attached is not limited to the cross member 3 but may be any portion which moves together when the collision load F is applied. For example, the attaching portions 110, 310 may be fixed to the floor panel 4 which is disposed further downwards of the vehicle body than the cross member 3.

While the attaching portions 110, 310 are described as being fixed to the cross member 3 or the floor panel 4, a configuration may be adopted in which a seat is provided between the cross member 3 or the floor panel 4 and the attaching portions 110, 310, so that the attaching portions 110, 310 are fixed to the seat. This configuration is preferred because the degree of freedom can be increased in selecting the attaching portion where the attaching portions 110, 310 are fixed.

In this embodiment including its modified example, since the collision load F is described as being applied from the rear of the vehicle, the attaching portions 110, 310 are disposed at the rear of the vehicle which constitutes the input side of the collision load F. However, when the collision load F is inputted from the front of the vehicle and onboard equipment to be fixed is disposed at the front of the vehicle, the attaching portions 110, 310 should be disposed further forwards towards the front of the vehicle which is the outside of the vehicle body than the attaching portions 111, 311 so as to be fixed to a front portion of the vehicle body.

The application of the invention is not limited to the bracket which fixes the onboard equipment from the rear or front of the vehicle, and hence, the invention may be applied to a bracket which fixes the onboard equipment from the vehicle's width direction W.

According to the invention, since the attaching portion where the bracket is attached to vehicle body part and the attaching portion where the bracket is attached to the side surface of the onboard equipment are connected together by the connecting portions, the torsional strength against vibrations in the vertical direction of the vehicle body is increased, thereby making it possible to increase the mounting strength of the onboard equipment against the vertical vibrations. In addition, since the opening portion is formed in the area which is surrounded by the attaching portion to the vehicle body, the attaching portion to the onboard equipment and the connecting portions and the attaching portion to the vehicle body is disposed closer to the outside of the vehicle body than the attaching portion to the onboard equipment, the opening portion constitutes the brittle part when the collision load is inputted into vehicle body part, whereby the bracket becomes easy to be deformed when the collision load is inputted thereinto. Because of this, the load applied to the side surface of the onboard equipment can be mitigated by the brackets which resist the collision load so inputted, thereby making it possible to prevent the damage to the onboard equipment that would otherwise be made by the brackets. This enables the realization of the mounting strength of the onboard equipment against vibrations in the vertical direction of the vehicle body and the safety of the vehicle when it is involved in a collision in a compatible fashion while suppressing the increase in the number of parts involved and the installation space.

This patent application is based upon Japanese Patent Application No. 2012-155621 filed on Jul. 11, 2012, the contents of which are incorporated herein byway of reference.

What is claimed is:

1. An onboard equipment fixing structure for an onboard equipment which is mounted in a vehicle, comprising:
    a bracket which fixes the onboard equipment to a vehicle body part of the vehicle, wherein the bracket includes:
    a vehicle body attaching portion which is attached to the vehicle body part;
    an equipment attaching portion which is attached to a side surface of the onboard equipment which extends in a vertical direction of a vehicle body;
    a connecting portion having a pair of opposing walls that erects from both sides of the vehicle body attaching portion in a perpendicular direction with respect to the vehicle body attaching portion and extends towards the equipment attaching portion, such that the connecting portion connects the vehicle body attaching portion and the equipment attaching portion,
    an opening portion which penetrates the bracket, and is defined by the vehicle body attaching portion, the equipment attaching portion, and the pair of side walls, and
    wherein the vehicle body attaching portion is fixed to the vehicle body part so as to be disposed closer to an outside of the vehicle body than the equipment attaching portion, and
    the connecting portion includes a brittle part which becomes a starting point of a deformation in a direction which intersects an input direction of a collision load.

2. The onboard equipment fixing structure according to claim 1, wherein
    the pair of opposing walls is formed so that a distance between the pair of opposing walls increases as the pair of opposing walls extends toward the equipment attaching portion.

3. The onboard equipment fixing structure according to claim 1, wherein
    the brittle part is a bend portion formed in each of the pair of opposing side walls, the bend portion is formed at a position between the vehicle body attaching portion and the equipment attaching portion.

4. The onboard equipment fixing structure according to claim 1, wherein
    the pair of opposing side walls extends in the vertical direction of the vehicle body.

5. The onboard equipment fixing structure according to claim 1, wherein
    the vehicle body attaching portion is configured to be attached to a cross member of the vehicle that extends in a perpendicular direction of the vehicle.

* * * * *